United States Patent
Takahashi et al.

[11] Patent Number: 5,923,718
[45] Date of Patent: Jul. 13, 1999

[54] BINARY COUNTER READING CIRCUIT

[75] Inventors: Hideaki Takahashi, Tokyo; Takayuki Nagai, Shizuoka, both of Japan

[73] Assignee: NEC Corporation, Tokyo, Japan

[21] Appl. No.: 08/918,586

[22] Filed: Aug. 19, 1997

[30] Foreign Application Priority Data

Aug. 19, 1996 [JP] Japan .................................. 8-235925

[51] Int. Cl.⁶ ............................................ H03K 21/08
[52] U.S. Cl. ............................ 377/114; 377/34; 377/56
[58] Field of Search .............................. 377/34, 56, 114

[56] References Cited

U.S. PATENT DOCUMENTS 5,045,854 9/1991 Windmiller .......................... 377/34
5,754,614 5/1998 Wingen .............................. 377/34

FOREIGN PATENT DOCUMENTS

| 55-168240 | 5/1979 | Japan . |
| 62-180612 | 8/1987 | Japan . |
| 5-291961 | 11/1993 | Japan . |
| 8-330970 | 12/1996 | Japan . |

*Primary Examiner*—Margaret R. Wambach

[57] ABSTRACT

An asynchronous reading circuit improves reliability of data read from a binary counter. Count data generated by a binary counter 101 according to a counting clock is converted into a gray code by a gray encoder. The count data represented by the gray code is sampled by a sampling circuit according to a timing signal asynchronous with the counting clock. The sampled count data is decoded into binary count data by a gray decoder.

6 Claims, 2 Drawing Sheets

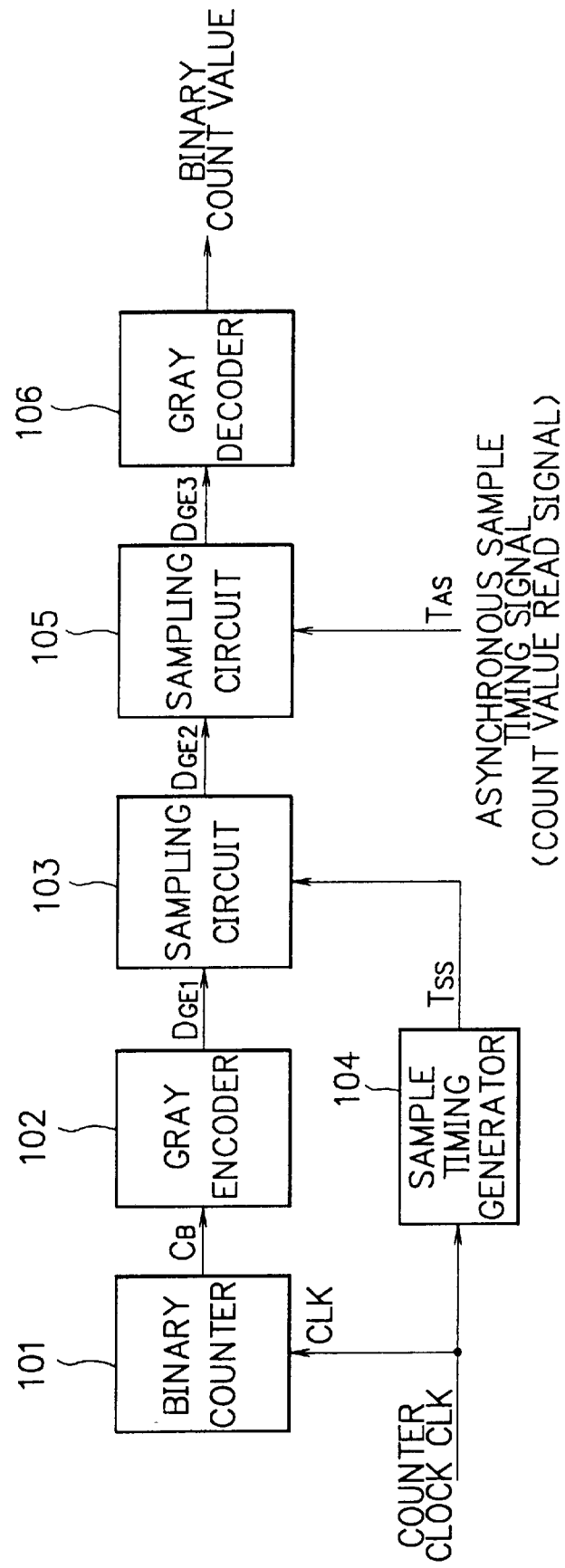

BINARY COUNTER READING CIRCUIT

BACKGROUND OF THE INVENTION

The present invention relates to a counter reading circuit, and in particular, to a binary counter reading circuit for reading a count value from a binary counter in an asynchronous manner.

Description of the Prior Art

In operation of a binary counter asynchronous reading circuit, a binary count value is read from a binary counter at externally supplied timing independent of timing used for a counting operation thereof.

FIG. 1 shows in a block diagram an example of an asynchronous binary counter reading circuit of the prior art. In a binary counter 201, a counting operation is accomplished in response to a counting clock CLK to send binary count data $C_B$ to a sampling circuit 202. The circuit 202 first samples count data $C_B$ from the binary counter 201 at timing of a count value read signal $T_{AS}$ which is asynchronous with the counting clock signal CLK and resultantly produces a binary count value. Therefore, even when the signal $T_{AS}$ is received at timing of the counting of the binary counter 201, the circuit 202 outputs therefrom the binary count data $C_B$ sampled at timing of the signal $T_{AS}$.

However, since an N-bit binary counter (N is a positive integer) produces count data of which the value of Hamming distance ranges from one to N, when the data read operation is accomplished at an asynchronous sample timing, it may possibly occur that data not related to the counting operation of the binary counter is sampled to be outputted as a count value. In the processing above, since the value attained through the sampling operation is directly outputted from the conventional asynchronous reading circuit and hence precision of data cannot be guaranteed.

SUMMARY OF THE INVENTION

It is therefore an object of the present invention to provide an asynchronous reading circuit for use with a binary counter capable of improving reliability of data read from the binary counter.

In accordance with the present invention, there is provided a binary counter reading circuit for use in a count data reading circuit for a binary counter in which a binary counting operation is conducted according to a clock signal having a predetermined frequency to thereby create count data. The reading circuit includes coding means for transforming the count data into a gray code and thereby producing first coded count data, sampling means for sampling the first coded count data according to a timing signal asynchronous with the clock signal and for thereby generating second coded count data, and decoding means for decoding the second coded count data represented in the gray code into the count data.

In accordance with a first aspect of the present invention, count data from the binary counter is transformed into a gray code. The gray code is then sampled at asynchronous timing to be inversely converted into original binary data. In other words, the data represent by the gray code is sampled at asynchronous timing. In the gray code system, the value of Hamming distance is kept fixed to one between the adjacent codes regardless of the number of bits of the binary counter. Therefore, even when timing of the asynchronous count value read signal externally supplied matches a change point of binary count data produced from the binary counter, there can be obtained the binary count data with a guaranteed quality.

Additionally, in accordance with the present invention, there is provided a binary counter reading circuit for use in a count data reading circuit for a binary counter in which a binary counting operation is conducted according to a clock signal having a predetermined frequency to thereby create count data. The reading circuit includes coding means for transforming the count data into a gray code and thereby producing first coded count data; timing generating means for generating a first timing signal according to the clock signal, the first timing signal being delayed for a predetermined period of time relative to the clock signal; first sampling means for sampling the first coded count data according to the first timing signal and for thereby generating second coded count data; second sampling means for sampling the second coded count data according to a second timing signal asynchronous with the clock signal and for thereby generating third coded count data; and decoding means for decoding the third coded count data represented in the gray code into the count data.

In accordance with a second aspect of the present invention, count data of the binary counter is converted into a gray code, which is then sampled at timing slightly delayed relative to the counting clock signal. The sampled gray-code data is then sampled at asynchronous timing to be reversely transformed into original binary data. In the gray-code data obtained from the decoding means, there occurs a glitch at a point of time when the count data of the binary counter changes. However, since the gray-code data is once sampled at the slightly delayed timing, there can be acquired the gray-code data in a stable state. This advantageously improves stability of the asynchronously read data.

BRIEF DESCRIPTION OF THE DRAWINGS

The objects and features of the present invention will become more apparent from the consideration of the following detailed description taken in conjunction with the accompanying drawings in which:

FIG. 2 is a block diagram showing an embodiment of the binary counter reading circuit in accordance with the present invention.

DESCRIPTION OF THE PREFERRED EMBODIMENT

Figure 1:
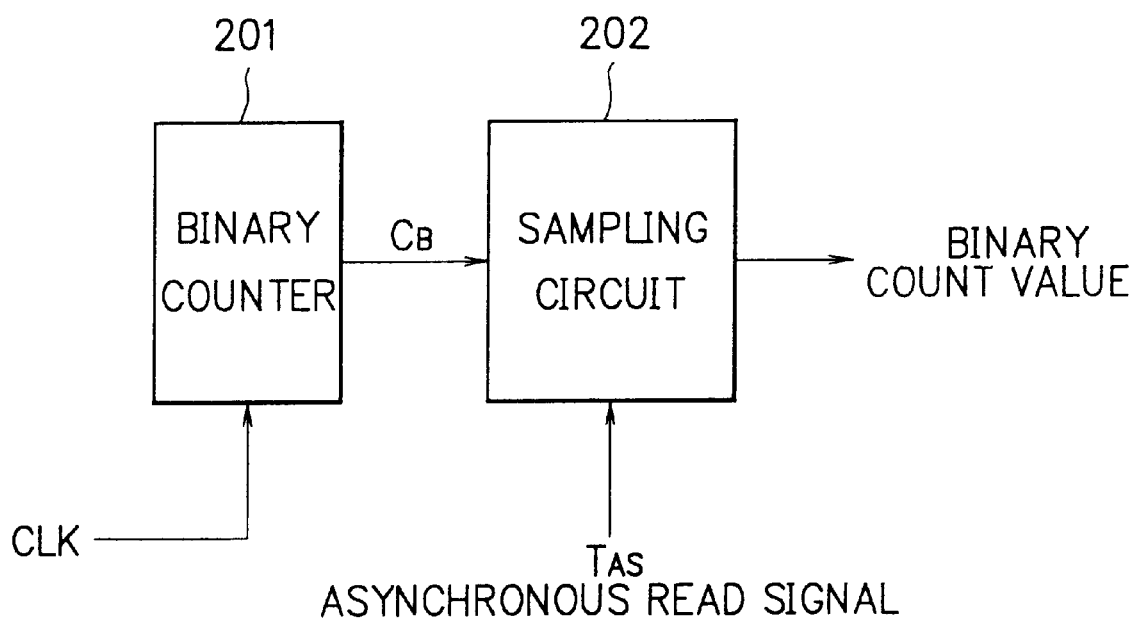
FIG. 1 is a block diagram showing an example of a conventional binary counter reading circuit of the prior art.

FIG. 2 shows in a block diagram an embodiment of the binary counter reading circuit in accordance with the present invention. In the configuration, a binary counter 101 conducts a counting operation according to a counting clock CLK to create binary count data $C_B$. A grey encoder 102 encodes the data $C_B$ from the binary counter 101 into a gray code to thereby generate gray code count data $D_{GE1}$. A sampling circuit 103 samples, in accordance with a sample timing signal $T_{SS}$ from a sample timing generator 104, the gray code count data $D_{GE1}$ generated by the gray encoder 102 to produce gray code count data $D_{GE2}$. Additionally, a sampling circuit 105 samples, according to a count value read signal $T_{AS}$ asynchronous with the counting clock signal CLK, the count data$_{GE2}$ from the sampling circuit 103 to thereby create gray code count data $D_{GE3}$. Finally, a gray decoder 106 decodes the data $D_{GE3}$ from the sampling circuit 105 into binary data to resultantly output therefrom a binary count value.

The sample timing generator 104 creates the sample timing signal $T_{SS}$ according to the counting clock CLK. The signal $T_{SS}$ is produced at timing slightly delayed relative to the clock CLK and is then fed to the sampling circuit 103. Using the signal $T_{SS}$, the circuit 103 can sample the gray code count data $D_{GE1}$ without causing an event of glitch. Specifically, in the gray code count data $D_{GE1}$ from the gray encoder 102, there occurs a glitch at timing at which the binary counter 101 increments the binary count data $C_B$. Consequently, when the data $D_{GE1}$ is sampled in accordance with the timing signal $T_{SS}$ slightly delayed with respect to the clock CLK, it is possible for the sampling circuit 103 to sample the count data $D_{GE1}$ which is stable after the occurrence of the glitch so as to produce the gray code count data $D_{GE2}$.

Assume that the gray code count data $D_{GE2}$ outputted from the sampling circuit 103 in response to the sample timing signal $T_{SS}$ from the timing generator 104 is in a transient state between a value before sampling and a value after sampling and the count value read signal $T_{AS}$ is supplied to the sampling circuit 105 in this state. In the circuit 105, the data $D_{GE2}$ before or after sampling is obtained as sampled data. However, the data is expressed in the gray code and hence Hamming distance between two codes before and after sampling is kept fixed to one regardless of the number of bits of the binary counter 101. Therefore, the gray code count data obtained before or after the incrementing operation of the binary counter 101 is sampled in the circuit 105. In short, even when the reading operation is carried out at asynchronous timing, the count value is somewhat associated with that attained from the binary counter 101. The data $D_{GE3}$ thus produced is transformed into binary data by the gray decoder 106.

In contrast therewith, when sampling data outputted from an N-bit binary counter in the conventional reading circuit, the value of Hamming distance of the signals from the binary counter ranges from one to n. This means that data not associated with the counting operation may possibly be read therefrom depending on the sample timing. Moreover, the obtained data is directly outputted without any correction or modification.

In accordance with the present invention described above, the data from the binary counter is represented in the gray code such that the gray-code count value is sampled at asynchronous read timing. Subsequently, since the attained count value is decoded into binary data, there is obtained an advantageous effect that the correct count value can be acquired even when Hamming distance of signals from the binary counter is equal to or more than two.

While the present invention has been described with reference to the particular illustrative embodiment, it is not to be restricted by the embodiment but only by the appended claims. It is to be appreciated that those skilled in the art can change or modify the embodiments without departing from the scope and spirit of the present invention.

What is claimed is:

1. A binary counter reading circuit for use in a count data reading circuit for a binary counter in which a binary counting operation is conducted according to a clock signal having a predetermined frequency to thereby create count data, comprising:

coding means for transforming the count data into a gray code and thereby producing first coded count data;

sampling means for sampling the first coded count data according to a timing signal asynchronous with the clock signal and for thereby generating second coded count data; and decoding means for decoding the second coded count data represented in the gray code into the count data.

2. A binary counter reading circuit for use in a count data reading circuit for a binary counter in which a binary counting operation is conducted according to a clock signal having a predetermined frequency to thereby create count data, comprising:

coding means for transforming the count data into a gray code and thereby producing first coded count data;

timing generating means for generating a first timing signal according to the clock signal, the first timing signal being delayed for a predetermined period of time relative to the clock signal;

first sampling means for sampling the first coded count data according to the first timing signal and for thereby generating second coded count data;

second sampling means for sampling the second coded count data according to a second timing signal asynchronous with the clock signal and for thereby generating third coded count data; and decoding means for decoding the third coded count data represented in the gray code into the count data.

3. A binary counter reading circuit in accordance with claim 2, wherein the delay time of the first timing signal relative to the clock signal is more than a continuous period of a transient state of the coding means occurring when the count data is changed.

4. A binary counter reading circuit in accordance with claim 2, wherein the first sampling circuit samples the first coded count data in a stable state after a glitch occurs in the first coded count data.

5. A binary counter reading method for use in a count data reading method for a binary counter in which a binary counting operation is conducted according to a clock signal having a predetermined frequency to thereby create count data, comprising the steps of:

transforming the count data into a gray code and thereby producing first coded count data;

sampling the first coded count data according to a timing signal asynchronous with the clock signal and for thereby generating second coded count data; and decoding the second coded count data represented in the gray code into the count data.

6. A binary counter reading method for use in a count data reading method for a binary counter in which a binary counting operation is conducted according to a clock signal having a predetermined frequency to thereby create count data, comprising the steps of:

transforming the count data into a gray code and thereby producing first coded count data;

generating a first timing signal according to the clock signal, the first timing signal being delayed a predetermined period of time relative to the clock signal;

sampling the first coded count data according to the first timing signal and for thereby generating second coded count data;

sampling the second coded count data according to a second timing signal asynchronous with the clock signal and for thereby generating third coded count data; and decoding the third coded count data represented in the gray code into the count data.

* * * * *